(12) United States Patent
Watson et al.

(10) Patent No.: US 8,425,060 B2
(45) Date of Patent: Apr. 23, 2013

(54) SELF-CORRECTING OPTICAL ELEMENTS FOR HIGH-THERMAL-LOAD OPTICAL SYSTEMS

(75) Inventors: Douglas C. Watson, Campbell, CA (US); Alton H. Phillips, East Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 1239 days.

(21) Appl. No.: 11/983,615

(22) Filed: Nov. 9, 2007

(65) Prior Publication Data

US 2009/0122429 A1    May 14, 2009

(51) Int. Cl.
*G02B 5/08* (2006.01)

(52) U.S. Cl.
USPC ........................................................ 359/846

(58) Field of Classification Search .......... 359/846–849, 359/820
See application file for complete search history.

(56) References Cited

U.S. PATENT DOCUMENTS

| | | | |
|---|---|---|---|
| 6,513,939 B1 * | 2/2003 | Fettig et al. | 359/847 |
| 6,621,957 B1 | 9/2003 | Sullivan et al. | |
| 6,859,121 B2 * | 2/2005 | Arima | 335/78 |
| 2003/0085723 A1 | 5/2003 | Martens et al. | |
| 2005/0254111 A1 * | 11/2005 | Griffith et al. | 359/224 |

OTHER PUBLICATIONS

U.S. Appl. No. 11/983,611, filed Nov. 9, 2007 Alton H. Phillips and Douglas C. Watson.
U.S. Appl. No. 12/001,529, filed Dec. 11, 2007 Sogard et al.
International Search Report, issued by the International Searching Authority in corresponding International Application No. PCT/US08/79076, Dec. 15, 2008.

* cited by examiner

*Primary Examiner* — Jennifer L. Doak
(74) *Attorney, Agent, or Firm* — Klarquist Sparkman, LLP (57) ABSTRACT

Mirrors and other optical elements are disclosed that include a body defining an optical surface (typically a reflective surface) and an opposing second surface. The body has a coefficient of thermal expansion (CTE). The optical element includes a correcting portion (e.g., a layer) attached to the second surface and having a CTE that, during heating of the optical element, imparts a bending moment to the body that at least partially offsets a change in curvature of the optical surface caused by heating. The body can be internally cooled. The body and correcting portion desirably are made of respective thermally conductive materials that can vary only slightly in CTE. The body desirably has a lower CTE than the correcting portion, and the correcting portion can be tuned according a variable property of the body and/or reflective surface. The body and correcting portion desirably function cooperatively in a thermally bimetallic-like manner.

33 Claims, 8 Drawing Sheets

SELF-CORRECTING OPTICAL ELEMENTS FOR HIGH-THERMAL-LOAD OPTICAL SYSTEMS

FIELD

This disclosure pertains to, inter alia, reflective optical elements such as mirrors. More specifically, the disclosure pertains to cooling or otherwise regulating the temperature of reflective optical elements that, for example, experience heating when irradiated or undergo a temperature change during use.

BACKGROUND

In various types of optical systems, the constituent optical elements such as lenses, filters, and/or mirrors are impinged with the radiation with which the system is used. If an optical element absorbs some of the incident radiation and especially if the incident radiation is intense, the element likely will experience a significant increase in temperature. Such a temperature change can thermally distort an optical element, for example the reflective surface of a mirror. With many types of optical systems, the intensity of radiation is normally too low to cause significant heating of the elements, the system can continue to function satisfactorily despite being heated, or any thermal-distortion effects of heating can be accommodated without any significant degradation of system performance. But, in other optical systems, especially systems used for extremely demanding imaging applications and the like, thermal distortion of one or more optical elements can degrade the system's overall optical performance to below specifications.

Certain types of optical systems are designed and constructed to such extremely tight dimensional and geometrical tolerances that serious attention must be directed to avoiding excessive heating of the constituent optical elements. Examples of such systems are astronomical telescopes, certain types of space-borne optical systems, high-power laser systems, and microlithography systems. Indeed, many types of optical systems that normally operate in a vacuum probably could benefit from such attention.

Most current microlithography systems use wavelengths of deep ultraviolet (DUV) light ($\lambda$=150 to 250 nm) for imaging purposes. To achieve further improvement of imaging resolution, substantial research is being directed to the development of practical microlithography systems that use "extreme ultraviolet" (EUV) wavelengths, in the range of 11 to 14 nm. Whereas optical systems (such as projection-optical systems) for use with DUV light are usually mostly to fully refractive, no materials are currently known that are sufficiently transmissive to EUV light and that exhibit a usable refractive index to EUV light for use in making EUV lenses. Consequently, current EUV optical systems are entirely reflective and usually comprise multiple mirrors each having a multilayer EUV-reflective coating on its reflective surface to provide the mirror with a usable reflectivity (approximately 70%, maximum) to EUV light at non-grazing angles of incidence.

Most practical EUV sources are very intense and radiate a large amount of energy. (Also, a large effort is currently underway to increase the intensity of EUV sources, particularly portable EUV sources, substantially over current sources.) EUV-reflective mirrors often experience heating during use because their multilayer reflective coatings absorb a substantial amount (with current mirrors, approximately 30% or more) of the incident EUV radiation. The mirror situated closest to the EUV source, such as the most upstream mirror in an illumination-optical system, typically absorbs more energy than any other mirror of the system. By way of example, in EUV microlithography systems currently under development for high-throughput use, the radiant-energy load for the mirror closest to the EUV source can be 1 kW or greater. This radiant load typically includes EUV light in the desired wavelength band as well as substantial out-of-band (OoB) light. Similarly, mirrors used in other high-power optical systems, such as certain laser systems, experience substantial heat loads. As the mirror absorbs energy from incident light, the mirror temperature increases. If precautions are not taken under such conditions, the mirror can experience thermal effects (e.g., expansion) that can cause an unacceptable degradation of optical performance of and possible fracture or other damage to the mirror.

To reduce thermal effects on mirrors in EUV systems, at least some of the mirrors are conventionally made of a material having a very low coefficient of thermal expansion (CTE). An exemplary low-CTE material used for making conventional EUV mirrors is ZERODUR®, made by Schott, Germany. Unfortunately, this and other low-CTE materials tend to have low thermal conductivity, which poses a challenge in removing heat at a desired rate from the reflective surface of the mirror.

Figure 1A:
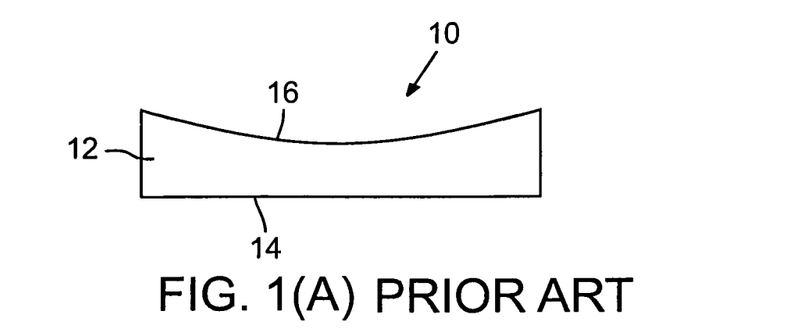
FIG. 1(A) is an elevational view of a conventional mirror having a concave reflective surface.
Figure 1B:
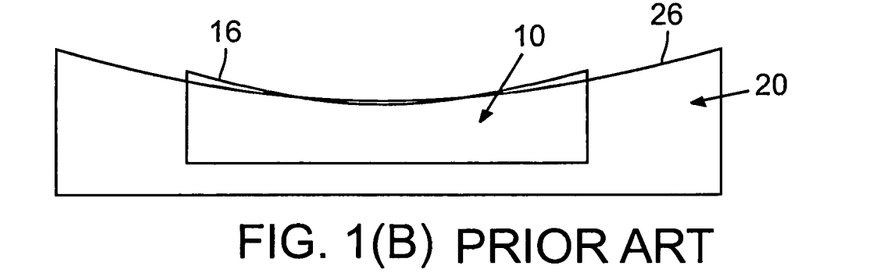
FIG. 1(B) is an elevational view of the mirror of FIG. 1(A) before heating (smaller profile) and after heating (larger profile), with their respective reflective surfaces registered with each other to depict the change (increase) in the curvature radius of the reflective surface upon heating.

A mirror of which the body is made substantially of a single material typically has a substantially uniform CTE throughout the body. If such a mirror simply experiences an overall increase in temperature, the temperature increase will be accompanied by a substantially uniform expansion of the mirror, which inevitably changes the curvature of the reflective surface of the mirror. For very demanding applications, this change can be significant. An example is shown in FIGS. 1(A)-1(B). Turning first to FIG. 1(A), the elevational profile of a conventional mirror 10 at ambient temperature is shown. The mirror 10 has a body 12, a base 14, and a reflective surface 16. The reflective surface 16 is concave at a particular radius of curvature. Heating the mirror 10 causes the mirror to expand, which results in a slight change in the radius of curvature of the reflective surface 16. The result of this change is shown in FIG. 1(B), showing the ambient-temperature mirror 10 (at the same scale as depicted in FIG. 1(A)) and a "warmer" mirror 20 (shown larger to highlight the effect). The reflective surface 26 of the warmer mirror 20 has an altered radius of curvature, as evidenced by the lack of superimposability of the respective profiles of the reflective surfaces 16, 26. Although the change in curvature radius may appear minor, such a change can substantially degrade the optical performance of the mirror especially if the mirror is used in an extremely high-precision optical system such as a microlithography system.

To reduce these and other thermal effects, there are several conventional approaches to removing heat from the mirror during use. One conventional method involves simply allowing the heat to radiate from the mirror. This method is inefficient and can provide an inadequate rate of cooling, especially of a mirror located close to the source of radiant energy. Another method involves mounting the mirror to a mass to which heat is conducted from the mirror, such as via the mirror mountings, for example. This method is also inefficient for high heat loads and can subject the mirror to high thermal and/or mechanical stresses.

Yet another conventional approach involves cooling the mirror with a temperature-regulated liquid circulated through cooling channels defined in the mirror body. This approach as currently implemented has several problems. First, it is difficult to form the channels in the mirror body, especially without having to fabricate the body of multiple pieces that are bonded together. Second, cooling channels inevitably form different thermal gradients in different portions of the mirror, such as one thermal gradient in the upper portion between the irradiated reflective surface and the cooling channels, and another thermal gradient in the lower portion between the cooling channels and the base of the mirror. Consequently, despite the mirror being liquid-cooled, the upper portion still exhibits greater thermal expansion than the lower portion, which changes the curvature of the reflective surface. Third, to prevent undesirable changes to the reflective surface (e.g., "print-through" of the cooling channels to the reflective surface as the reflective surface is being machined), the cooling channels must be located some distance, in the thickness dimension of the mirror, from the reflective surface. Since the reflective surface is where the cooling channels are most needed, any significant thickness of mirror body between the cooling channels and the reflective surface produces thermal gradients. Fourth, especially if the reflective surface has curvature, it is extremely difficult or impossible using cooling channels to achieve a uniform rate of heat removal from all portions of the reflective surface, simply because the body thickness between the curved reflective surface and the cooling channels is not uniform. Hence, different thermal gradients are established across the mirror that typically produce greater thermal expansion of hotter portions of the mirror (e.g., between the reflective surface and the cooling channels) relative to cooler portions. These differential expansions can produce substantial stress in the mirror and can cause unacceptable changes in the curvature of the reflective surface.

Yet another challenge to liquid cooling a mirror is the manner in which the liquid is circulated through the channels. More specifically, whereas turbulent flow of the liquid through the channels can provide for efficient heat transfer and cooling than laminar flow, turbulent flow often generates vibrations within the mirror. These vibrations may be transmitted through the microlithography system, which can compromise the accuracy of microlithographic processes performed by the system.

Increasing the flow rate of the coolant through the mirror body can reduce the rate of temperature rise and the overall temperature rise of the mirror. But, increasing the flow rate may generate turbulence, and increasing the flow rate also usually does not yield any substantial change in the temperature gradients between the reflective surface and the coolant channels.

One conventional approach to reducing temperature gradients is making the mirror of a material having high thermal conductivity. However, the available materials satisfying this criterion tend to have larger CTEs, wherein a combination of high thermal conductivity and high CTE tends to produce relatively large temperature rises of the mirror during use, and consequent significant changes in mirror shape. Another conventional approach is to make the mirror of a material having a low CTE to reduce the overall expansion of the mirror during heating. However, the few available materials satisfying this criterion tend to have lower thermal conductivity. Consequently, heating the reflective surface of the mirror tends to increase the temperature gradients in the mirror (reflective surface versus the mirror body).

Yet another conventional approach to mirror cooling involves mounting the mirror's rear surface to a cooling plate. The cooling plate is actively cooled by circulating temperature-controlled liquid through cooling channels or passages formed in the plate. Unfortunately, even with such a cooling plate, the reflective surface of the mirror changes shape whenever a heat load is applied to it, because: (a) there remains a temperature gradient between the reflective surface and the cooling plate that causes the mirror to bend and, with a concave reflective surface, increase its radius of curvature; and (b) the entire mirror heats up and expands, which increases the radius of curvature of a concave reflective surface. Again, low-CTE materials reduce this problem, but they have disadvantages as discussed above.

Excessive heating of the reflective surface of a mirror also can damage the coating(s) on the surface. Furthermore, heating the reflective surface can increase radiative heat transfer from the mirror to other surfaces and components in the optical system, which can have a degradative effect overall.

Therefore, a need exists for mirrors and other optical elements, used in high-intensity optical systems and other systems in which the elements may undergo substantial heating, that exhibit reduced changes in their optical surfaces (and thus in their optical performances) while withstanding their conditions of use.

SUMMARY

The foregoing need is satisfied by optical elements (e.g., mirrors), methods, and other aspects of the subject invention, as disclosed herein.

According to one aspect, optical elements are provided. An embodiment comprises a body and a "correcting portion." The body defines an optical surface and a second surface. The body is made of at least one material having a respective coefficient of thermal expansion (CTE). The correcting portion is attached to the second surface and has a respective CTE that, during heating of the optical element, imparts a bending moment to the body that at least partially offsets a change in curvature of the optical surface resulting from the heating. The name "correcting portion" is not intended to imply that the correcting portion acts alone, in all embodiments, in offsetting the change in curvature. In many embodiments the correcting portion acts in concert with the body to achieve the offset. In some embodiments this cooperative effect is in the manner of a "bimetallic" thermal response exhibited by an item constructed of two materials having different CTEs.

In many embodiments the optical surface is an obverse surface of the body, and the second surface is a reverse surface of the body. The second surface can be opposite the optical surface.

The body can be internally cooled, or not internally cooled. If the former, the body can define at least one coolant conduit, which can have any of a wide variety of configurations depending on the specific cooling need.

In certain embodiments the body is made of a material such as, but not limited to, any of various metals, silicon, silicon carbide, invar, ceramic, quartz, glass, and alloys and combinations thereof. Desirably, the CTE of the body is lower than the CTE of the correcting portion, even if only slightly different.

In many embodiments the correcting portion is configured as a layer or "plate." The correcting portion can have uniform thickness or variable thickness. The variation in thickness can be based on a variable property of the body such as, but not limited to, CTE data of the body or curvature of the optical surface.

The body can comprise multiple body portions, such as first and second body portions, bonded together. If the body is internally cooled, an advantageous location of at least cooling conduit is between the first and second body portions.

In many embodiments the correcting portion is bonded to the second surface of the body. Any of various bonding methods can be used such as, but not limited to, soldering, brazing, frit-bonding, or using a high-thermal-conductivity adhesive.

Another embodiment of an optical element comprises a first portion and a second portion. The first portion has a first CTE, and obverse optical surface, and a reverse surface. The second portion has a second CTE different from the first CTE to form an optical element having a thermally bimetallic-like property that offsets changes in curvature of the obverse surface as the optical element is heated. The first and second portions can be configured as respective layers. The second portion can be a substantially uniform-thickness layer or a variable-thickness layer. The variable thickness can be based on a varying property of the first portion, such as (but not limited to) varying CTE, varying thickness of the first portion, and varying curvature of the obverse optical surface. Another possible varying property of the first portion can be a difference in thermal expansion of the first portion in one dimension relative to another dimension.

Another embodiment of an optical element comprises first and second portions. The first portion has a first CTE and an optical surface. The second portion is bonded to the first portion and has a second CTE that is different from the first CTE. The first and second portions cooperatively provide the optical element with a bimetallic-like property by which the optical element self-corrects at least some of the change in curvature of the optical surface that otherwise would occur upon heating the optical element.

According to another aspect, mirrors are provided. An embodiment comprises a body and a correcting layer. The body defines a reflective surface and a second surface, wherein the correcting layer is bonded to the second surface. The body is made of at least one material having a respective CTE. The correcting layer has a respective CTE that, during heating of the mirror, imparts a bending moment to the body that at least partially offsets a change in curvature of the reflective surface resulting from the heating. The body and correcting layer in many embodiments cooperatively provide the mirror with a bimetallic-like property by which the change in curvature of the reflective surface is offset.

The reflective surface can be planar or have a curvature. The curvature in many embodiments is concave, but other curvatures are possible. The curvature can be spherical, aspherical, cylindrical, or irregular.

The mirror can be internally cooled or not internally cooled.

In certain embodiments the body comprises multiple body portions configured as respective layers bonded together at an interface between the body portions. In some embodiments the interface defines at least one coolant conduit in a mirror that is internally cooled.

In many embodiments the body has a lower CTE than the correcting portion. This is especially desirable if the reflective surface is concave.

The correcting layer can have a substantially uniform thickness or have a variable thickness. The correcting layer can have a thickness that is tuned based on a variable property of the body, such as (but not limited to), CTE or a thickness profile.

According to another aspect, optical systems are provided that comprise at least one optical element or mirror as summarized above.

According to yet another aspect, exposure systems are provided that comprise at least one mirror as summarized above.

According to yet another aspect, microelectronic-device manufacturing processes are provided that comprise the steps of preparing a substrate, processing the substrate, and assembling microelectronic devices formed on the substrate. The process step comprises the steps of (i) applying a resist to the substrate; (ii) exposing the resist; and (iii) developing the resist; and step (ii) comprises providing an exposure system as summarized herein, and using the exposure system to expose the resist with the pattern defined on the reticle.

The foregoing and additional features and advantages of the invention will be more readily apparent from the following detailed description, which proceeds with reference to the accompanying drawings.

DETAILED DESCRIPTION

This disclosure is set forth in the context of representative embodiments that are not intended to be limiting in any way.

In the following description, certain terms may be used such as "up," "down,", "upper," "lower," "horizontal," "vertical," "left", "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

The following description is set forth in the context of "mirrors" as exemplary optical elements. Representative mirrors include, but are not limited to, planar mirrors, collimator mirrors, beam-expanding mirrors, condenser mirrors, and fly-eye mirrors. It will be understood that the principles described below can also be utilized with other types of optical elements having an optical surface that is vulnerable to thermal effects of radiant heating. These other types of elements may be any of, for example, reflective gratings, filters, prisms, and the like. Each such element comprises at least one optical surface (e.g., a reflective surface) that can be curved or planar. If curved, the optical surface can be spherical or aspherical. The optical surface can be configured for on-axis or off-axis illumination. The optical surface can be surficial or embedded, the latter as in certain prisms for example. Hence, in the following, use of the word "mirror" will be understood to encompass these other types of optical elements as well.

Figure 2A:
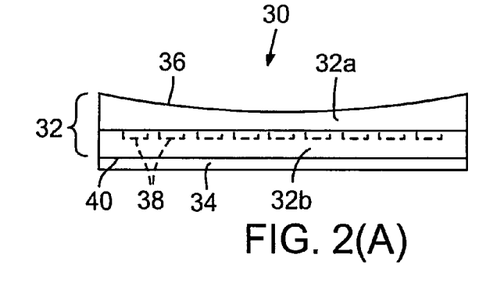
FIG. 2(A) is an elevational view of an embodiment of a mirror, including two body layers (defining coolant conduits between them), a reflective surface, and a correcting portion configured to correct thermal deformation of the reflective surface; the conduits have rectangular transverse profiles.

Referring, e.g., to FIG. 2(A), various embodiments of a mirror 30 comprise a body 32 having an optical surface 36 that is at least partially reflective to incident light (hence, the surface 36 is generally termed a "reflective surface"). The body 32 also has an opposing surface 40. In a "plan" view (viewed from above the reflective surface) the body 32 can have any of various shapes such as (but not limited to) round, rectilinear, arc-shaped, polygonal, annular, or irregular. The reflective surface 36 can cover the entire surface visible in the plan view or alternatively can cover discrete portion(s) of the surface. Although the reflective surface 36 is depicted as being concave, this is not intended to be limiting. Some embodiments have a planar reflective surface 36, for example. It also will be understood that the reflective surface 36 could be convex in certain embodiments.

The mirror 30 can be internally cooled or not internally cooled. Mirrors that are internally cooled comprise one or more conduits 38 usually located in the body 32 of the mirror. A liquid coolant is circulated through the conduits 38. The coolant desirably is temperature-regulated (e.g., maintained at a desired temperature using a feedback-controlled temperature-regulating device such as used in a closed-loop circulating liquid-coolant bath), and is circulated desirably at a controlled flow rate. The flow of coolant can be under laminar-flow or turbulent-flow conditions, depending upon circumstances of use. (E.g., turbulent flow may be tolerable in a fly-eye mirror but may not be tolerable in a collimator mirror.) A particular advantage of the mirror embodiments described below, however, is that in certain instances the internal conduits can be eliminated, which provides more options for mirror configurations and reduces mirror cost.

Figure 2B:
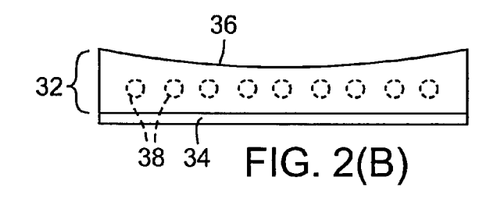
FIG. 2(B) is an elevational view of an embodiment of a mirror, including a unitary body (in which coolant conduits have been formed), a reflective surface, and a correcting portion configured to correct thermal deformation of the reflective surface; the conduits have round transverse profiles.
Figure 2C:
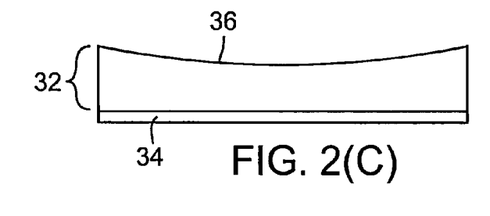
FIG. 2(C) is an elevational view of an embodiment of a mirror, including one body layer (no coolant conduits), a reflective surface, and a correcting portion configured to correct thermal deformation of the reflective surface.
Figure 2D:
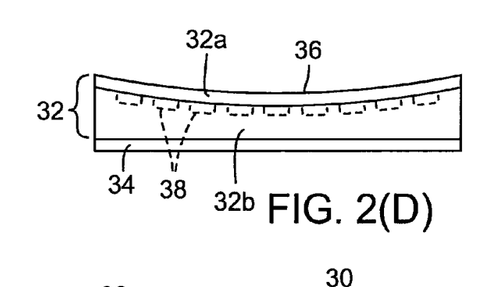
FIG. 2(D) is an elevational view of an embodiment of a mirror, including two body layers (in which coolant conduits have been formed), a reflective surface, and a correcting portion configured to correct thermal deformation of the reflective surface. The upper body layer is a constant thickness with a concave reflective surface, the conduits are at a uniform depth relative to the reflective surface.

The at least one conduit 38 can be defined in a unitary (one-piece) body 32, if practical, such as shown in FIG. 2(B). See also FIG. 4(A). Alternatively, the body 32 can comprise multiple (at least two) body portions 32a, 32b, wherein the conduit(s) 38 are defined in a respective face of at least one body portion and the faces are subsequently bonded together to define the conduit(s) in the body. The body portion 32a is an "upper" portion, and the body portion 32b is a "lower" portion. Examples are shown in FIGS. 2(A) and 2(D). Generally, forming the conduits 38 using multiple body portions 32a, 32b is advantageous mostly for ease of manufacture of a mirror including the conduits. The body portions 32a, 32b can have any of several configurations. FIG. 2(D) depicts one embodiment having an upper body portion 32a of which the upper face is the curved reflective surface 36 and the lower face substantially follows the curvature of the upper surface. FIG. 2(A) depicts another embodiment having an upper body portion 32a of which the lower face does not follow the curvature of the reflective surface 36 (e.g., is substantially planar).

Figure 3A:
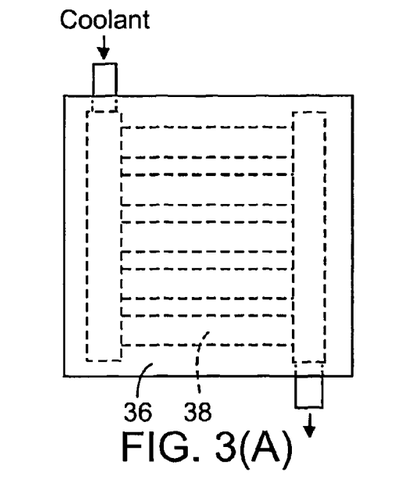
FIG. 3(A) is a plan view of an embodiment of a mirror in which the cooling conduits are in a parallel-flow configuration.
Figure 3B:
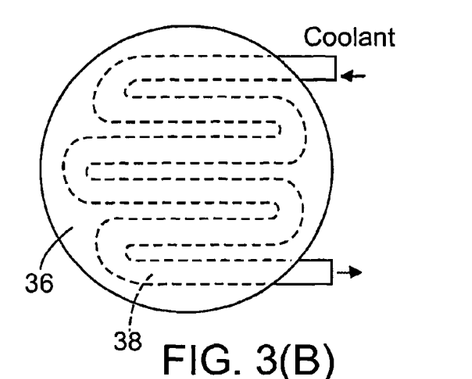
FIG. 3(B) is a plan view of an embodiment of a mirror in which the cooling conduits are in a serpentine, series-flow configuration.

Desirably, the body portions 32a, 32b are made of the same material, but this not intended to exclude the possibility of their being made of different materials. Example materials include, but are not limited to, silicon, ZERODUR® (Schott), copper, and invar. The conduits 38 can have any of various transverse profiles. See, e.g., FIGS. 2(A), 2(B), 2(D), 4(A).) The transverse profiles of the conduits 38 can be all the same shape and dimensions or alternatively can be different shapes and/or dimensions. The conduit(s) 38 can be arranged in any of various ways in the body 32 of the mirror 30, and the arrangements can be simple or complex, or a combination of simple and complex. Example simple arrangements include, but are not limited to, parallel-flow arrangements (see example in FIG. 3(A)), series-flow arrangements (e.g., FIGS. 3(B) and 3(C)), rectilinear-flow arrangements (FIG. 3(C)), radial-flow arrangements (FIG. 3(D)), serpentine-flow arrangements (FIG. 3(B)), spiral-flow arrangements, etc., and combinations thereof. Other arrangements, including more complex arrangements (some of which including microchannels), are discussed in U.S. patent application Ser. No. 11/382,342, filed on May 9, 2006, incorporated herein by reference.

As evident from the previous paragraph, the size, configuration, orientation, and arrangement of the conduits of an internally cooled mirror can vary widely. The particular configuration and orientation of conduits 38 are selected based on various factors such as desired flow dynamics of the coolant, type of coolant, temperature of the coolant, desired rate of cooling of the mirror, area of the mirror to be cooled, desired pressure drop in the conduits, etc. In a particular mirror, use of conduits having substantially the same dimensions may provide relatively uniform heat removal if the incident radiation on the reflective surface is approximately uniform. Alternatively, the dimensions associated with the conduits and their arrays can be varied to compensate for non-uniformities in the incident radiation. I.e., the heat-transfer rate associated with the mirror can be varied across the reflective surface by implementing different dimensions and layouts of the conduits.

In a multi-portion mirror body 32, the body portions 32a, 32b are bonded together by any of various bonding methods that provide good thermal conductivity between the body portions and that do not interfere with the optical function of the mirror 30. Example bonding methods include, but are not limited to, soldering, brazing, frit-bonding, and use of adhesive (e.g., high-thermal-conductivity epoxy). Frit-bonding forms a glass bond, which can also be used to join the outside edges of the body portions 32a, 32b. The particular bonding method selected will depend largely upon the materials from which the body portions 32a, 32b are made. Bonding desirably is performed "internally" (at the interface of the body portions 32a, 32b) and "externally" (around the outside edges of the body portions). Bonding the outside edges effectively seals the body 32. Usually, the same bonding material is used for internal and external bonding purposes. The body portions 32a, 32b desirably are bonded together in a continuous manner, in contrast to discrete attachment (e.g., screws or pins) to enable good thermal conductivity between the body portions. Also, the selected bonding material and method desirably yield a bond that is resistant to creep.

The various mirrors disclosed herein comprise, in addition to the single- or multi-piece body 32, a "correcting portion" 34. The correcting portion 34 is bonded to the lower face of the body 32 (or rear face of the body portion 32b) desirably in a continuous manner. The bonding method is generally the same as described above for joining body portions together. I.e., bonding desirably is achieved by a method that provides good thermal conductivity between the body 32 and the correcting portion 34 and that provides a sound bond that resists creep. Example bonding methods include, but are not limited to, soldering, brazing, frit-bonding, and use of adhesive (e.g., high-thermal-conductivity epoxy). Another manner of bonding is simply forming the correcting portion 34 at the desired location on the surface of the body 32. The particular bonding method selected will depend largely upon the materials from which the body 32 (or body portion 32b) is made.

The correcting portion 34 desirably is made of a material having a higher CTE than the material(s) of the body 32. I.e., in general, the correcting portion 34 has a lower CTE and the body 32 has a higher CTE. The correcting portion 34 also desirably has relatively high thermal conductivity and low heat capacity. (Materials having a high thermal conductivity and low heat capacity tend to exhibit, inter alia, better transient responses to changes in the duty cycle of illumination on the mirror body 32.) Exemplary materials for the correcting portion 34 are, but are not limited to, copper, silicon, SiC, aluminum, and the like. It is noted that the body 32 and correcting portion 34 can be made of similar but slight different materials (e.g., different respective alloys of copper) having different respective CTEs. As noted below, this difference in CTE can be very slight (see Example). High-conductivity materials tend to have low thermal gradients, so little change in temperature distribution in the mirror body 32, or in the mirror shape, would be realized whether the mirror is receiving illumination energy or not. Other factors that desirably are considered include the elastic modulus of the material of the correcting portion 34 and the relative thicknesses of the body 32 and correcting portion 34.

Assuming that radiant energy is absorbed by the reflective surface 36 and hence the body 32, the CTE of the correcting portion 34 need not be much higher than of the body 32; in many instances only a slight difference is sufficient for the correcting portion 34 to impart the requisite correction to the curvature of the reflective surface 36. As shown in FIG. 4(B), for example, the correcting portion 34 desirably is configured to bend naturally in a concave manner when heated. Thus, the correcting portion 34, in cooperation with the body 32, exhibits a bimetallic-like effect that corrects the increased radius of curvature of the reflective surface caused by heating of the body. Specifically, the concave deformation of the correcting portion 34 reduces the radius of curvature of the reflective surface 36, which in turn cancels the natural increase in the radius of curvature accompanying heating of the mirror.

First Representative Embodiment

Figure 4A:
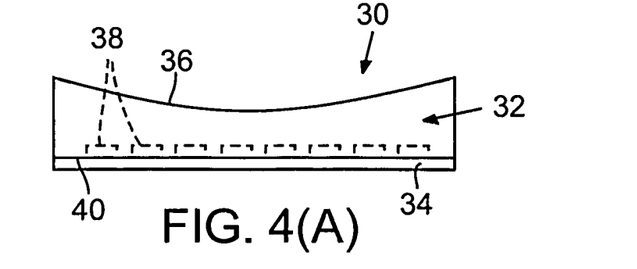
FIG. 4(A) is an elevational view of an embodiment of a mirror having a unitary body, a reflective surface, and a correcting portion configured to correct thermal deformation of the reflective layer; cooling conduits are formed at the interface between the correcting portion and the body.
Figure 4B:
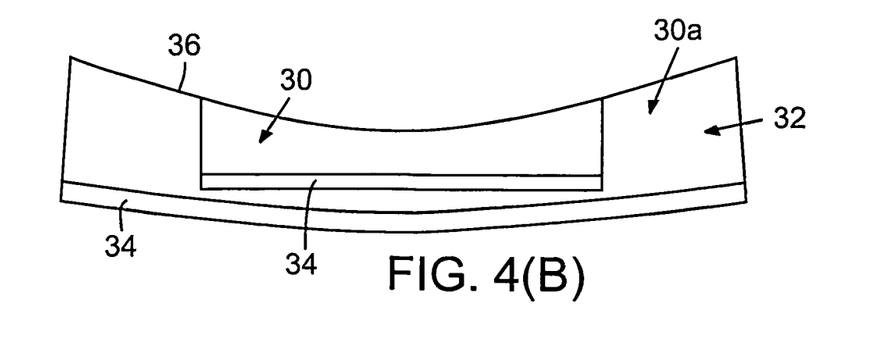
FIG. 4(B) is an elevational view in the form of superposition of the respective reflective surfaces of the mirror of FIG. 4(A) before heating (smaller profile) and after heating (larger profile), illustrating the correction imparted by the correcting portion to the reflective surface. The "after heating" profile is larger than the "before heating" profile to depict more clearly the correction to the reflective surface.

A first representative embodiment of an internally cooled mirror 30 is shown in FIGS. 4(A)-4(B). In FIG. 4(A) the mirror 30 includes a body 32 and a correcting portion 34. The body 32 is made of a lower-CTE material, and the correcting portion 34 is made of a higher-CTE material (higher than the CTE of the body 32).

In this embodiment coolant conduits 38 are defined in the body 32 at the interface of the body 32 and the correcting portion 34. As the overall temperature of the mirror 30 increases due to absorption of radiant energy at the reflective surface 36, the body 32 exhibits a thermal expansion that, in the absence of a countervailing effect, tends to increase the radius of curvature of the reflective surface. But, with the same mirror 30a in a heated condition, as shown in FIG. 4(B), the correcting portion 34 imparts a bending moment, in the manner of a bimetallic-like effect, to the mirror that tends to reduce the curvature radius of the reflective surface 36. Hence, the bending moment of the correcting portion 34 compensates for (offsets, reduces, or even substantially cancels) the thermal expansion of the body 32 (front layer), allowing the curvature radius of the reflective surface 36 to remain substantially unchanged. (In FIG. 4(B), note the near perfect superposition of the curves denoting the respective reflective surfaces 36.)

Second Representative Embodiment

The correcting portion 34 can be "tuned," or adjusted in thickness, in accordance with its particular CTE to optimize the compensation imparted by the correcting portion to the reflective surface 36. Tuning can facilitate, for a particular set of conditions and mirror configuration, maintaining the curvature of the reflective surface 36 substantially constant regardless of the overall temperature of the mirror 30. Tuning can also be used to change the curvature radius of the correcting portion 34 in a desired way during heating of the mirror 30 to compensate for a "piston effect" (net z-displacement) resulting from overall expansion of the mirror. Tuning can "tighten up" the curvature radius of the reflective surface 36 so as to exhibit the same focal point at any of various mirror temperatures.

As an example tuning situation, before manufacturing the mirror, the respective CTEs of the body and back-side materials can be accurately measured. (The CTE of a given material frequently varies, usually slightly, from one manufacturing batch of the material to another. This variation can be a significant variable in certain optical systems.) The thickness of the correcting portion 34, or the relative thicknesses of the body 32 and correcting portion, can be adjusted during manufacture of the mirror 30 to optimize the compensation.

By way of example, two different batches of material used for fabricating the body 32 have respective CTEs: $C_A$ and $C_B$, wherein $C_A$ is slightly lower than $C_B$. A mirror in which the body 32 is made of the $C_A$ batch of material could be made with a correspondingly slightly thicker correcting portion 34 to achieve the desired compensation to the curvature of the reflective surface 36. A mirror in which the body 32 is made of the $C_B$ batch of material would include a correspondingly slightly thinner correcting portion 34. In a mirror-fabrication facility, CTE data on incoming materials can be readily determined in the laboratory, such as at receiving-inspection, or supplied by the manufacturer of the material with the actual shipment of material to the mirror fabricator.

Third Representative Embodiment

In the second representative embodiment the correcting portion 34 is "tuned" by changing its overall thickness while keeping its thickness substantially constant in a particular mirror 30. This third representative embodiment is directed to several exemplary schemes for locally varying the thickness of the correcting portion 34 in a single mirror 30, rather than the correcting portion having a constant thickness overall. Thus, in certain situations, the third embodiment yields a more accurate compensation to the reflective surface 36 than the second embodiment, depending upon the particular fine compensation to the reflective surface that is desired.

In one example, the correcting portion 34 is locally tuned simply to achieve more complete or more accurate compensation to thermal changes in the reflective surface. In this example, the thickness of the correcting portion 34 is generally varied as required from one location to the next to facilitate reducing or preventing asphericity of the reflective surface 36 during heating of the mirror. In this regard, the variation of thickness of the correcting portion 34 of the mirror can, but need not unless required, follow any corresponding variation in the body 32. The thickness variation can be according to a particular pattern or can be irregular.

Figure 5:
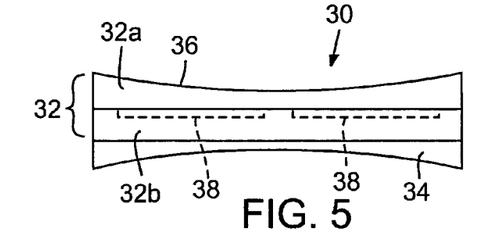
FIG. 5 is an elevational view of a mirror embodiment in which the thickness of the correcting portion is varied in accordance with variations in the thickness of the front layer of the mirror body. In this instance, the reflective surface is concave, and the coolant conduits have an elongated rectangular transverse profile in this view.
Figure 6:
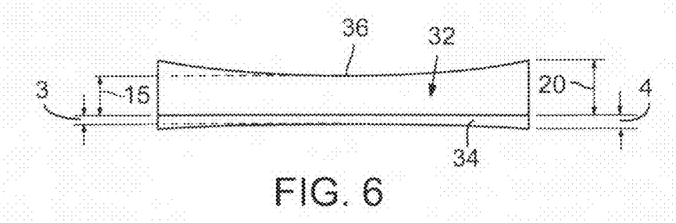
FIG. 6 is an elevational view of a mirror similar to that shown in FIG. 5, but including some exemplary dimensions.

In another example, the thickness of the correcting portion 34 is varied in accordance with variations in the thickness of the body 32. For example, as shown in FIG. 5, a mirror 30 is shown in which a concave reflective surface 36 is defined by the upper surface of the body 32. Turning to FIG. 6, the edge thickness of the body 32 is 20 units, and the axial thickness is 15 units. In this example, to achieve the desired compensation to the curvature of the reflective surface 36 upon heating of the mirror, the correcting portion 34 is formed having an edge thickness of 4 units and an axial thickness of 3 units. Thickness ratios may be followed; note that 20/15=4/3 in FIG. 6.

Figures 3C, 3D, 9:
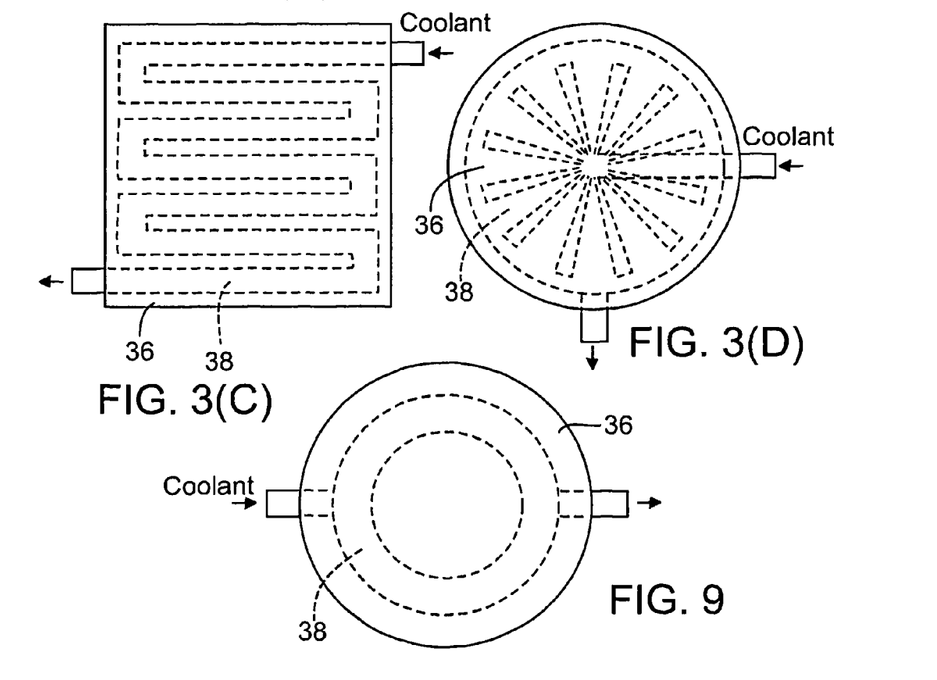
FIG. 3(C) is a plan view of an embodiment of a mirror in which the cooling conduits are in a rectilinear, series-flow configuration.
FIG. 3(D) is a plan view of an embodiment of a mirror in which the cooling conduits are in a radial-flow configuration.
FIG. 9 is a plan view of a mirror having an annular-shaped cooling conduit corresponding to an annular-shaped illumination region on the reflective surface of the mirror.
Figure 7:
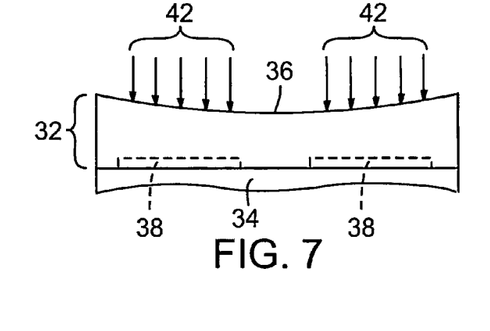
FIG. 7 is an elevational view of a mirror having an annular-shaped illumination area on the reflective surface. Coolant conduits are situated in regions, between the mirror body and thermally correcting portion, corresponding to illuminated regions of the reflective surface, and the correcting portion has a thickness profile that corresponds to the illuminated regions of the reflective surface.

In an alternative embodiment, the thickness of the correcting portion 34 is varied in accordance with whether the corresponding region of the reflective surface 36 is illuminated or not illuminated. An example is shown in FIG. 7, in which the irradiated portion (irradiation denoted by arrows 42) of the reflective surface 36 is annular. In this example, the correcting portion 34 can have a thickness profile as shown in FIG. 7, in which the correcting portion is thicker in regions corresponding to illuminated regions of the reflective surface 36, to provide the desired compensation to the curvature of the reflective surface. An exemplary coolant conduit 38 for this mirror is shown in FIG. 9.

Figure 8A:
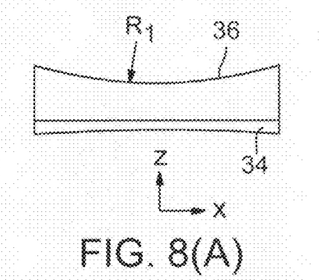
FIGS. 8(A)-(B) are orthogonal views of a mirror having a reflective surface with different curvature radii in the x- and y-directions, and a correcting portion having a thickness profile corresponding to the shape of the reflective surface.
Figure 8B:
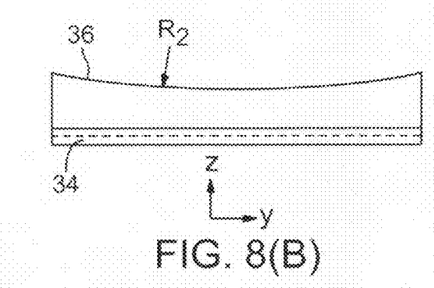

In certain situations, e.g., if the mirror 30 is not round and/or if the reflective surface 36 does not have the same nominal radius of curvature in each of the x- and y-directions, the correcting portion can be configured to impart an astigmatic correction to the reflective surface, as shown in FIGS. 8(A)-8(B). With respect to the reflective surface, note that $R_2 > R_1$ in this example (FIG. 8(A)), and the correcting portion is configured to have a particular radius of curvature in the x-direction and an infinite radius of curvature in the y-direction.

Mirrors as described above have especial application in any of various optical systems that are specified to operate according to extremely tight tolerances of imaging performance. An example of such an optical system is a projection-optical system as used in microlithographic exposure systems utilizing EUV light as exposure light. EUV optical systems are reflective because of the current unavailability of materials suitable for fabricating EUV lenses. The principles of the invention alternatively can be applied to projection-optical systems and other optical systems of exposure apparatus using light of other wavelengths, rather than EUV light, as exposure light.

EXAMPLE

Figure 10:
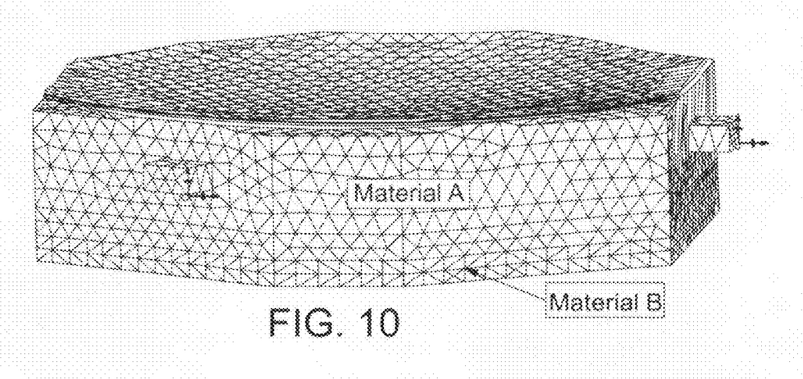
FIG. 10 is a perspective view of one of the mirrors constituting the Example. The grid is for finite-element analysis and not part of an actual mirror.
Figure 11A:
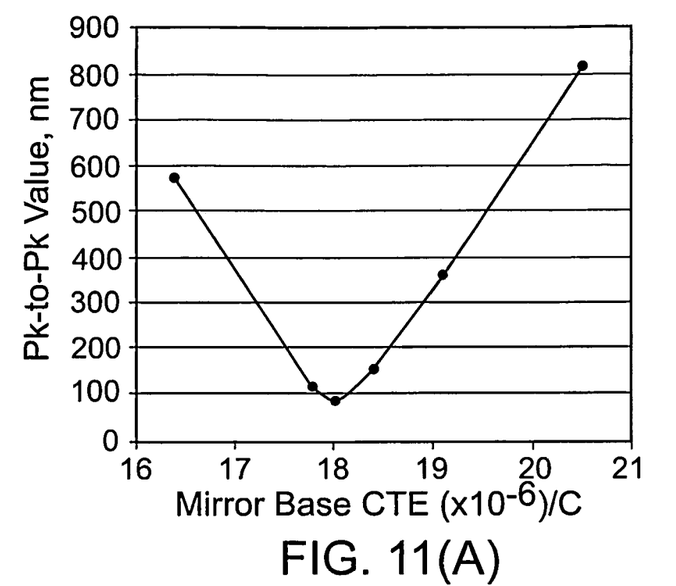
FIGS. 11(A)-11(B) are, with respect to the Example, respective plots of peak-to-peak surface distortion versus CTE of the correcting portions in mirrors in which the correcting portion had a thickness of 8 mm and of 5 mm, respectively.
Figure 11B:
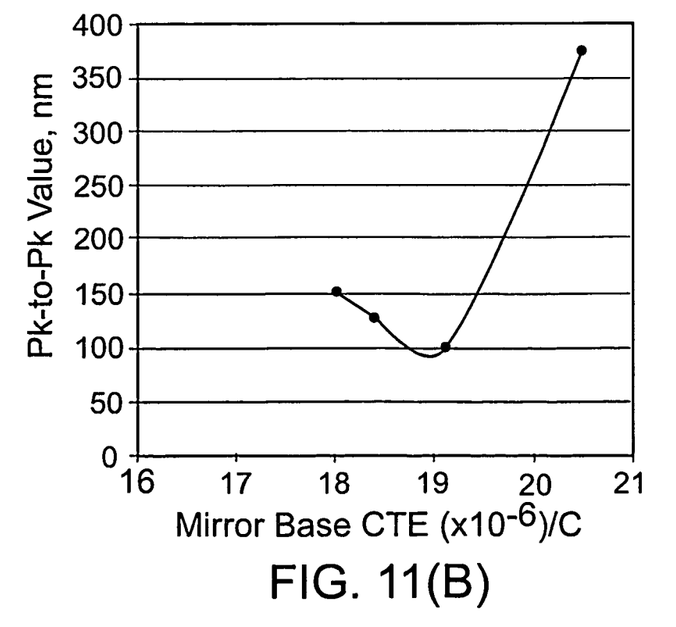

In this example, mirrors were fabricated having a configuration as generally shown in FIG. 10. Such mirrors were especially constructed for use in an EUV microlithography system. The material of the mirror body was a copper alloy ("Material A") having a CTE of $16.4 \times 10^{-6}/°$ C. The mirrors had a roughly octagonal plan profile, and included three mounting ears (two are visible in the drawing). The mirrors were not internally cooled, and were evaluated at a temperature of 4° C. above ambient temperature. A first group of mirrors was evaluated, of which the correcting portion ("Material B") was 8 mm thick copper alloy but had slightly different CTEs, and a second group of mirrors was fabricated, of which the correcting portion was 5 mm thick copper alloy but had slightly different CTEs. In each group, individual mirrors were evaluated in which the CTE of the correcting portion was the variable. With each mirror, the peak-to-peak surface distortion (in nm) was evaluated. Results are shown in FIGS. 11(A)-11(B). In FIG. 11(A) the minimum surface distortion was exhibited when the correcting portion, at a thickness of 8 mm, had a CTE of $18 \times 10^{-6}/°$ C. In FIG. 11(B) the minimum surface distortion was exhibited when the correcting portion, at a thickness of 5 mm, had a CTE of $19 \times 10^{-6}/°$ C.

Microlithography System Embodiment

Figure 12:
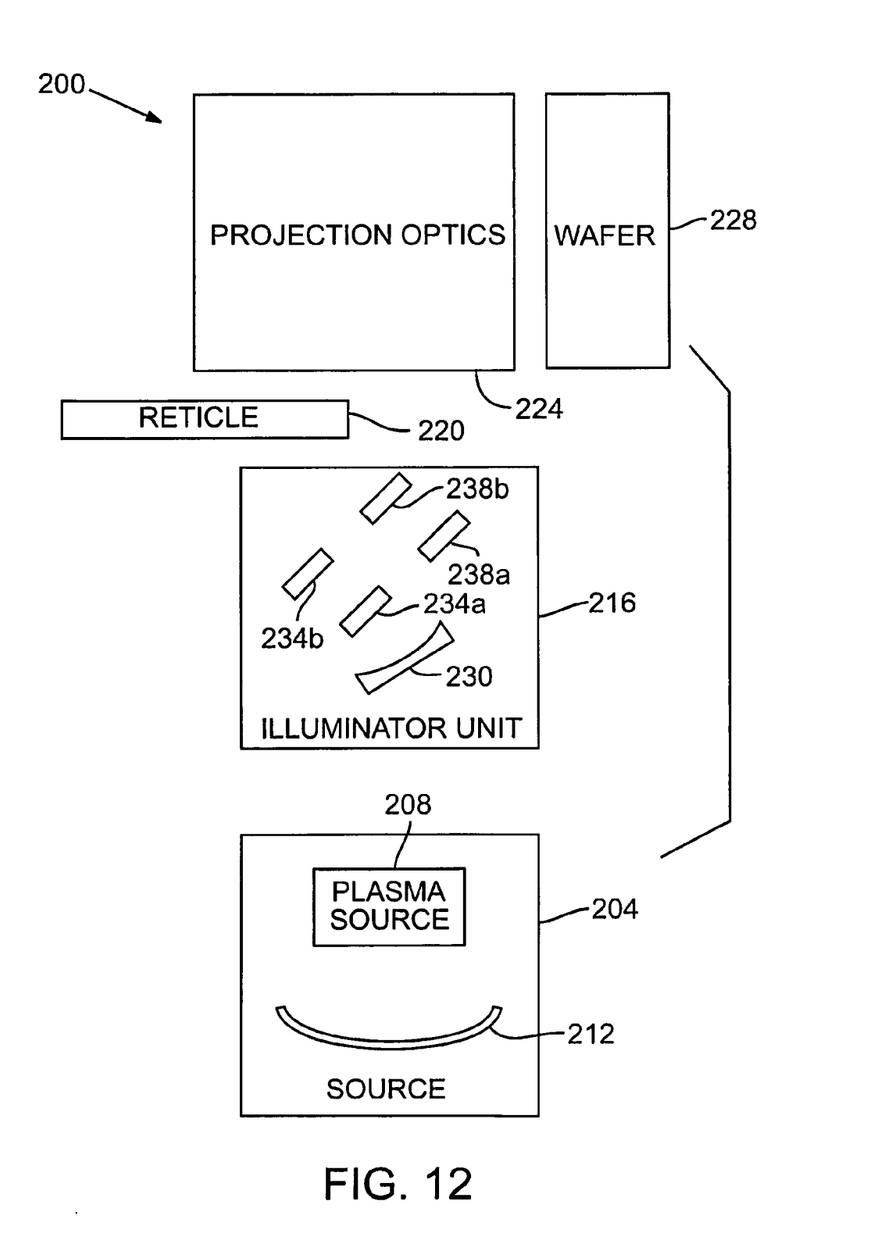
FIG. 12 is a block diagram of an EUV microlithography system embodiment comprising at least one mirror as described herein.

An embodiment of an EUV microlithography system 200 is shown in FIG. 12. The system 200 includes at least one mirror as described above. The system 200 includes a source 204, an illumination-optical system 216, a reticle 220, and projection-optical system 224, and is configured to imprint a pattern on a wafer 228 or other suitable lithographic substrate. The reticle 220 may generally be supported on a reticle-positioning stage, and the wafer 228 may generally be supported on a wafer-positioning stage. For ease of illustration, the reticle stage and wafer stage are not shown.

The source 204 generally includes a plasma source 208 and a collector mirror 212. The plasma source 208 may use a gas such as xenon as a laser-plasma target material. The plasma source 208 emits light that is collected by the collector mirror 212 and passed to the illumination-optical system 216. Light that is processed by the illumination-optical system 216 is reflected from the reticle 220 and passed through the projection-optical system 224 onto the wafer 228.

The illumination-optical system 216 includes a collimator mirror 230, multiple fly-eye mirrors 234a, 234b, and multiple condenser mirrors 238a, 238b. In general, the illumination-optical system 216 is situated and configured to condition the light emitted by the source 204 to improve the uniformity of the light. Light from the source 204 is partially absorbed by the collimator mirror 230 before being reflected onto the fly-eye mirrors 234a, 234b and condenser mirrors 238a, 238b. The fly-eye mirrors 234a, 234b generally have relatively complex-shaped reflective surfaces constructed of many concave mirror elements. The fly-eye mirror 234a receives light reflected from the collimator mirror 230 and reflects the light to the condenser mirror 238a. In turn, the condenser mirror 238a reflects light to the fly-eye mirror 234b, which reflects the light to the condenser mirror 238b.

Although substantially all the mirrors associated with the illumination-optical system 216 may be internally cooled using coolant fluid, some mirrors may be cooled using radiant methods. Typically, the collimator mirror 230 reflects approximately seventy percent of incident light. Hence, approximately thirty percent of incident light is absorbed by the collimator mirror 230. This thirty percent of absorbed radiation (e.g., approximately 90 Watts of energy in one embodiment) is difficult to remove from the mirror using radiant methods. Hence, the collimator mirror 230 is internally cooled, desirably with liquid coolant flowing through the mirror under laminar-flow or other non-turbulent flow conditions to minimize any temperature rise associated with the absorption of heat while also substantially minimizing vibration. This mirror 230 also desirably includes a correcting portion as described above.

Figure 13:
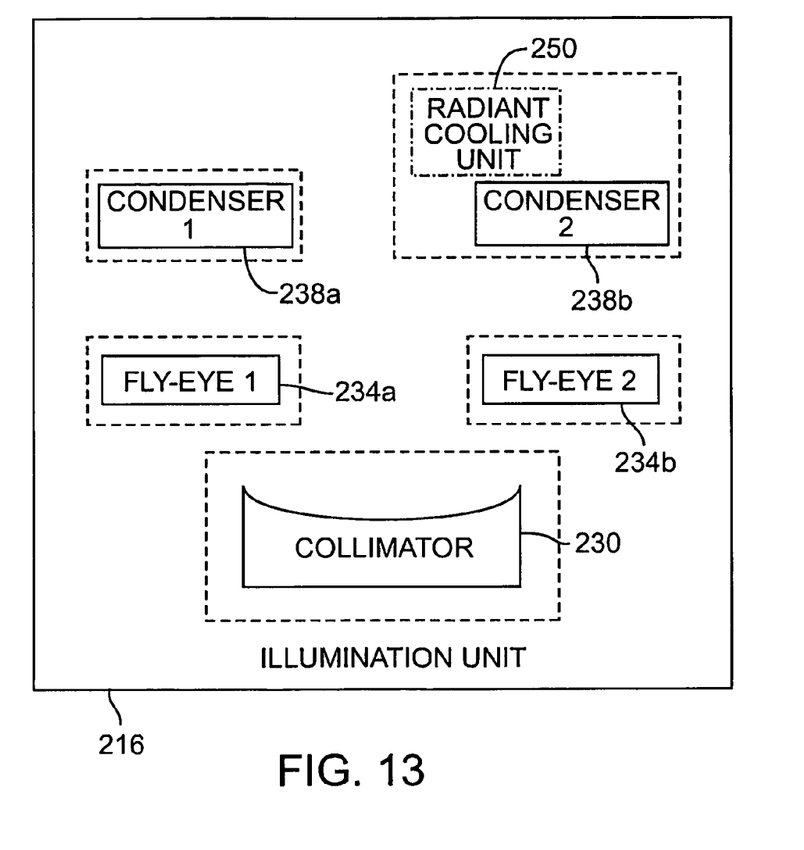
FIG. 13 is a block diagram of the illumination-optical system of the EUV microlithography system of FIG. 12.

The mirrors of the illumination unit 216 may be cooled a variety of ways, depending upon the mirror. FIG. 13 is a diagrammatic representation of the illumination-optical system 216 comprising mirrors that are differently cooled. For example, the collimator mirror 230 is internally cooled using a coolant fluid under laminar-flow conditions. The fly-eye mirrors 234a, 234b are also internally cooled, generally under turbulent-flow conditions. The condenser mirror 238b is also cooled, either radiantly or by internal cooling. Radiant cooling (e.g., using a radiant cooling unit 250) is advantageous with this mirror because it works and this method is less complex and less expensive than internal cooling. Also, radiant cooling may be adequate for the heat-load associated with the condenser mirror 238b.

Any of the internally cooled mirrors and any of the radiantly cooled mirrors in the system embodiment described above can be configured as generally described herein. Each such mirror has a "bimetallic-like" property (used in a figurative sense and not necessarily denoting that the mirror is made of two metals, rather denoting that the mirror is made of at least two materials that behave in a bimetallic way to correct curvature changes accompanying mirror heating from radiation absorption). I.e., in many embodiments, as the temperature of the mirror increases, the bimetallic-like effect introduces a countervailing (typically concave) deformation in the mirror. The concave deformation reduces the curvature radius of the reflective surface of the mirror, which is used to cancel the natural increase in the radius of curvature, as described above.

Notably, with an internally cooled mirror, the curvature of the mirror under no heat load can be tuned by minor adjustment from ambient of the temperature of the coolant entering the conduits in the mirror. If this coolant inlet temperature is maintained and the mirror configuration is properly tuned for no change in curvature, then it will work for any input illumination power.

Mirrors, as disclosed herein, having self-correcting curvature under conditions of heat load, provide generally improved performance of the optical system of which the mirrors are a part. Mirrors configured in this manner also allow the use of more common mirror materials, yielding more options and lower costs.

Figure 14:
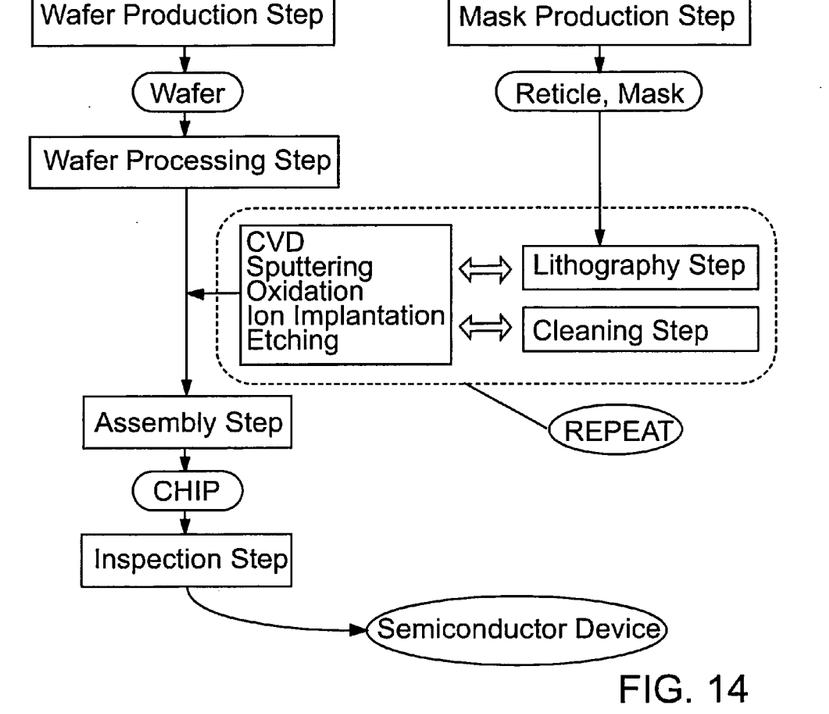
FIG. 14 is a block diagram of a method for fabricating micro-devices, the method including performing a microlithography step using a microlithography system as described herein.

FIG. 14 is a flowchart of an exemplary microelectronic-fabrication method in which a lithographic projection-optical system including at least one mirror, as disclosed herein, can be applied readily. The fabrication method generally comprises the main steps of wafer production (wafer manufacturing or preparation), reticle (mask) production or preparation; wafer processing, device (chip) assembly (including dicing of chips and rendering the chips operational), and device (chip) inspection. Each step usually comprises several sub-steps.

Among the main steps, wafer processing is key to achieving the smallest feature sizes (critical dimensions) and best inter-layer registration. In the wafer-processing step, multiple circuit patterns are layered successively atop one another on the wafer, forming multiple chips destined to be memory chips or main processing units (MPUs), for example. The formation of each layer typically involves multiple sub-steps. Usually, many operative microelectronic devices are produced on each wafer.

Typical wafer-processing steps include: (1) thin-film formation (by, e.g., sputtering or CVD) involving formation of a dielectric layer for electrical insulation or a metal layer for connecting wires or electrodes; (2) oxidation step to oxidize the substrate or the thin-film layer previously formed; (3) microlithography to form a resist pattern for selective processing of the thin film or the substrate itself; (4) etching or analogous step (e.g., dry-etching) to etch the thin film or substrate according to the resist pattern; (5) doping as required to implant ions or impurities into the thin film or substrate according to the resist pattern; (6) resist stripping to remove the remaining resist from the wafer; and (7) wafer inspection. Wafer processing is repeated as required (typically many times) to fabricate the desired microelectronic devices on the wafer.

Figure 15:
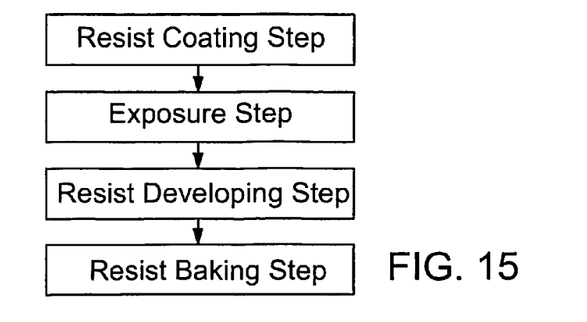
FIG. 15 is a block diagram of the microlithography step used in the method of FIG. 14.

FIG. 15 provides a flowchart of typical steps performed in microlithography, which is a principal step in the wafer-processing step shown in FIG. 14. The microlithography step typically includes: (1) resist-application step, wherein a suitable resist is coated on the wafer substrate (which an include a circuit element formed in a previous wafer-processing step); (2) exposure step, to expose the resist with the desired pattern by microlithography; (3) development step, to develop the exposed resist to produce the imprinted image; and (4) optional resist-baking step, to enhance the durability of and stabilize the resist pattern.

The process steps summarized above are all well known and are not described further herein.

Whereas the invention has been described in connection with representative embodiments, it will be understood that the invention is not limited to those embodiments. On the contrary, the invention is intended to encompass all modifications, alternatives, and equivalents as may be included in the spirit and scope of the invention, as defined by the appended claims.

What is claimed is:

1. An optical element, comprising:
a body defining an optical surface and a second surface, the optical surface receiving an incident light flux, and the body having a respective coefficient of thermal expansion (CTE) and being passively heated by the light flux incident on the optical surface; and
a correcting portion bonded to the second surface, the correcting portion having a respective CTE that, during a heating of the optical element by the incident light flux, passively and automatically imparts a bending moment to the body that at least partially offsets a change in curvature of the optical surface that otherwise would be caused by the heating.

2. The optical element of claim 1, wherein the body is actively cooled.

3. The optical element of claim 1, wherein the CTE of the body is lower than the CTE of the correcting portion.

4. The optical element of claim 1, wherein the correcting portion is configured as a layer.

5. The optical element of claim 4, wherein the layer has a substantially uniform thickness.

6. The optical element of claim 4, wherein the layer has a variable thickness.

7. The optical element of claim 4, wherein the layer has a thickness selected based on CTE data of the body.

8. The optical element of claim 1, wherein:
the optical surface is a reflective surface; and
the second surface is opposite the optical surface.

9. An optical element, comprising:
a first portion having a first coefficient of thermal expansion (CTE), an obverse optical surface, and a reverse surface; and
a second portion on the reverse surface, the second portion having a second CTE different from the first CTE to form a thermally bimetallic-like optical element that offsets a heat-induced change in curvature of the obverse surface that otherwise would occur as the optical element is heated.

10. The optical element of claim 9, wherein the CTE of the first portion is lower than the CTE of the second portion.

11. The optical element of claim 9, wherein the first and second portions are configured as respective layers.

12. The optical element of claim 11, wherein the second portion is a substantially uniform-thickness layer.

13. The optical element of claim 11, wherein:
the second portion is a variable-thickness layer; and
the variable thickness of the second portion is based upon a varying property of the first portion.

14. The optical element of claim 13, wherein the varying property of the first portion pertains to curvature of the obverse optical surface.

15. The optical element of claim 13, wherein the varying property of the first portion pertains to a difference in thermal expansion of the first portion in one dimension relative to another dimension.

16. An optical element, comprising:
a first portion having a first coefficient of thermal expansion (CTE) and an optical surface; and
a second portion bonded to the first portion and having a second CTE different from the first CTE;
the first and second portions cooperatively providing the optical element with a bimetallic-like property by which the optical element self-corrects at least some of a change in curvature of the optical surface that otherwise would occur upon heating the optical element.

17. A mirror, comprising:
a body defining a reflective surface and a second surface substantially opposite the reflective surface, the body being made of at least one material having a respective coefficient of thermal expansion (CTE); and
a correcting layer bonded to the second surface, the correcting layer having a respective CTE that, during heating of the mirror, imparts a bending moment to the body that at least partially offsets a change in curvature of the reflective surface resulting from the heating.

18. The mirror of claim 17, wherein the body and correcting layer cooperatively provide the mirror with a bimetallic-like property by which the change in curvature of the reflective surface is offset.

19. The mirror of claim 17, wherein the body has a lower CTE than the correcting layer.

20. The mirror of claim 17, wherein the correcting layer has a thickness that varies according to a variable property of the body.

21. A method for correcting radiation-induced thermal deformation of a reflective optical element having a respective coefficient of thermal expansion (CTE), a reflective surface arranged to receive radiation, and a reverse surface, the method comprising:
bonding the reverse surface to a correcting portion having a respective CTE that is different from the CTE of the optical element sufficiently to cause differential thermal expansion of the correcting portion relative to thermal expansion of the optical element as passively caused by radiation impinging on the reflective surface adding heat energy to the optical element; and
as the radiation impinges on and passively adds heat energy to the optical element and correcting portion, allowing the correcting portion to impart a bending moment passively and automatically to the optical element that at least partially offsets a thermal deformation of the reflective surface that otherwise would result from the radiation-induced heating of the reflective optical element.

22. The method of claim 21, further comprising actively cooling the optical element.

23. The method of claim 21, wherein:
the reflective surface is concave; and
the CTE of the correcting portion is greater than the CTE of the optical element.

24. The method of claim 21, further comprising:
determining an expected thermal deformation of the reflective surface caused by the heating of the optical element; and
selecting a property of the correcting portion to offset, at least partially, the expected thermal deformation of the reflective surface.

25. The method of claim 21, further comprising tuning the bending moment.

26. An optical element, comprising:
a body defining an optical surface and a second surface, the optical surface receiving an incident light flux, and the body having a coefficient of thermal expansion (CTE) and being passively heated by the light flux incident on the optical surface; and
a correcting portion bonded to the second surface and having a CTE that is different from the CTE of the body, wherein the correcting portion, during heating of the optical element by the incident light flux, passively and automatically imparts a bending moment to the body that at least partially offsets a change in curvature of the optical surface that would result from a heating of the optical element by the incident light flux.

27. The optical element of claim 26, wherein the body is actively cooled.

28. The optical element of claim 26, wherein the CTE of the body is lower than the CTE of the correcting portion.

29. The optical element of claim 26, wherein the correcting portion is configured as a layer.

30. The optical element of claim 29, wherein the layer has a substantially uniform thickness.

31. The optical element of claim 29, wherein the layer has a variable thickness.

32. The optical element of claim 29, wherein the layer has a thickness selected based on CTE data of the body.

33. The optical element of claim 26, wherein:
the optical surface is a reflective surface; and
the second surface is opposite the optical surface.

* * * * *